(12) United States Patent
Yamamoto et al.

(10) Patent No.: US 8,367,559 B2
(45) Date of Patent: Feb. 5, 2013

(54) METHOD OF MANUFACTURING A SEMICONDUCTOR DEVICE

(75) Inventors: Hironori Yamamoto, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 89 days.

(21) Appl. No.: 13/013,554

(22) Filed: Jan. 25, 2011

(65) Prior Publication Data

US 2011/0183526 A1   Jul. 28, 2011

(30) Foreign Application Priority Data

Jan. 26, 2010   (JP) ................. 2010-014649

(51) Int. Cl.
*H01L 21/31* (2006.01)

(52) U.S. Cl. ................. 438/778; 438/788; 257/E21.191

(58) Field of Classification Search .................. 438/771, 438/776; 257/E21.16, E21.191, E21.207, 257/E21.282

See application file for complete search history.

(56) References Cited

U.S. PATENT DOCUMENTS

| | | | |
|---|---|---|---|
| 6,780,790 B2 | 8/2004 | Shioya et al. | |
| 7,531,891 B2 | 5/2009 | Ohto et al. | |
| 7,948,083 B2 * | 5/2011 | Dimitrakopoulos et al. | . 257/758 |
| 2009/0246538 A1 | 10/2009 | Yamamoto et al. | |
| 2009/0267198 A1 | 10/2009 | Tada et al. | |
| 2010/0025852 A1 | 2/2010 | Ueki et al. | |

FOREIGN PATENT DOCUMENTS

| | | |
|---|---|---|
| JP | 2003-234346 A | 8/2003 |
| JP | 2007-142066 A | 6/2007 |
| WO | 2007/132879 A1 | 11/2007 |
| WO | 2008/010591 A1 | 1/2008 |
| WO | 2008/078649 A1 | 7/2008 |

* cited by examiner

*Primary Examiner* — Cheung Lee
(74) *Attorney, Agent, or Firm* — Sughrue Mion, PLLC

(57) ABSTRACT

Characteristics of a low-k insulating film grown on a substrate is modulated in the thickness-wise direction, by varying the ratio of high-frequency input and low-frequency input used for inducing plasma in the course of forming the film, to thereby improve the adhesion strength while keeping the dielectric constant at a low level, wherein the high-frequency input and the low-frequency input for inducing plasma are applied from a single electrode, while elevating the level of low-frequency input at least either at the start of formation or at the end of formation of the insulating film, as compared with the input level in residual time zone.

13 Claims, 23 Drawing Sheets

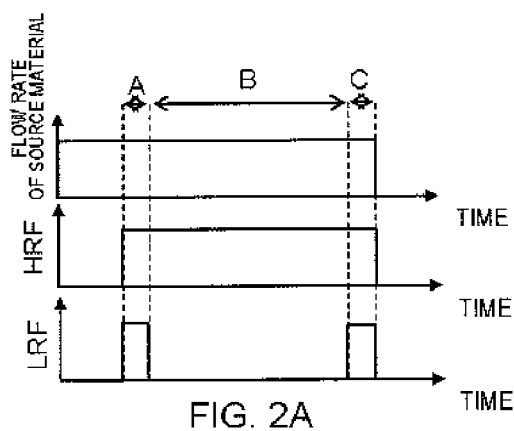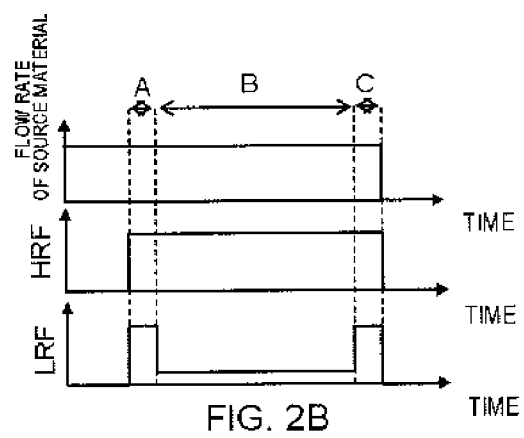

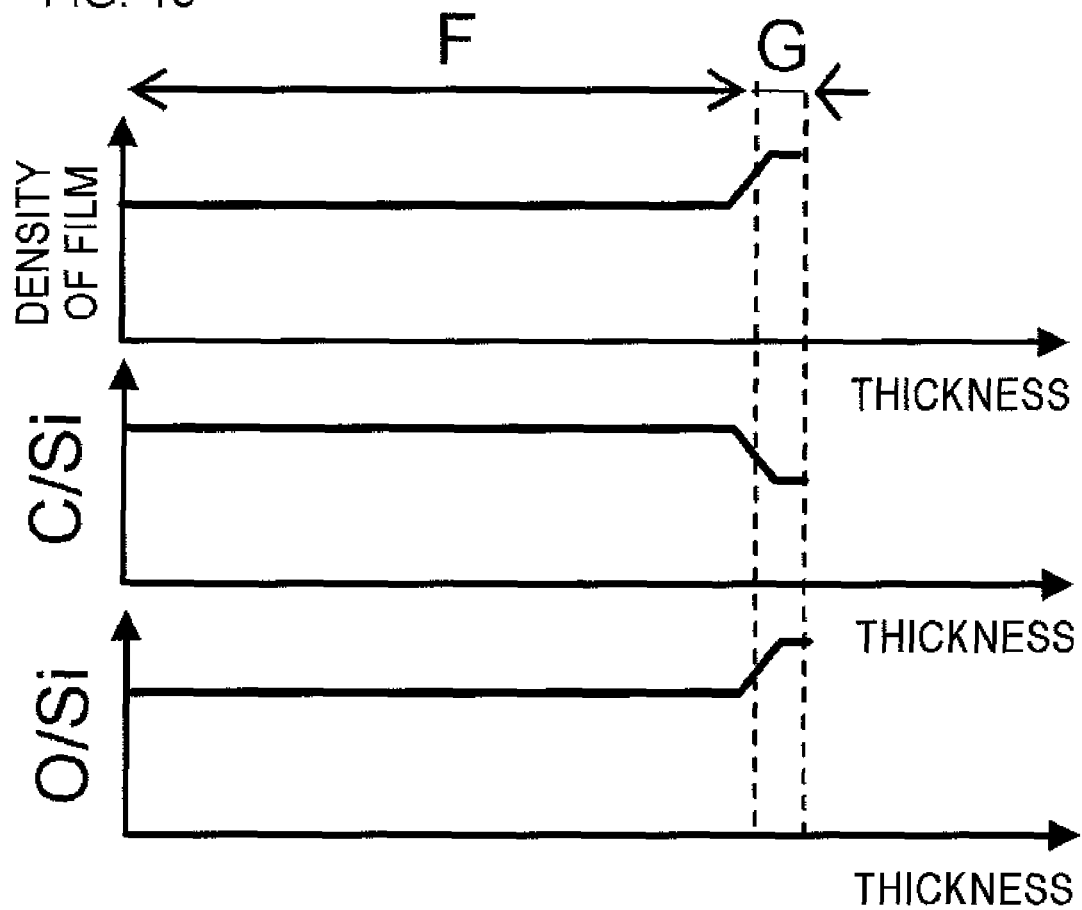

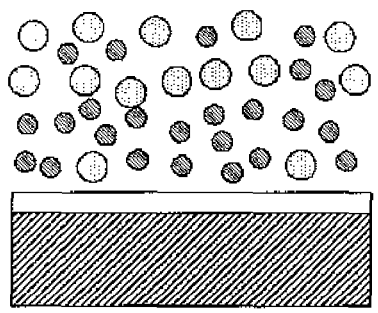
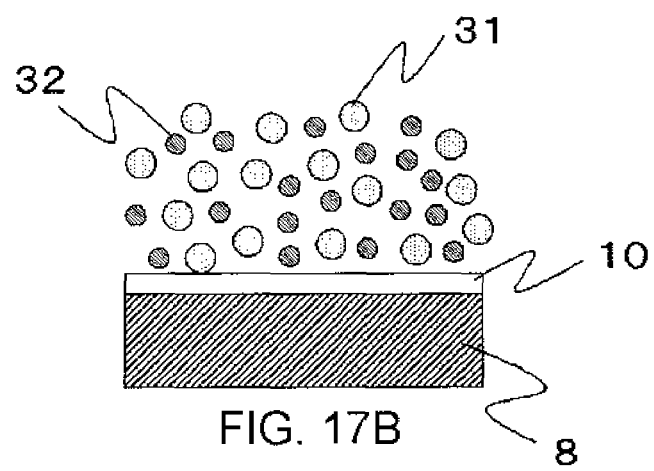
FIG. 17A
FIG. 17B

☐ ACCEPTABLE  ■ UNACCEPTABLE

METHOD OF MANUFACTURING A SEMICONDUCTOR DEVICE

This application is based on Japanese patent application No. 2010-014649 the content of which is incorporated hereinto by reference.

BACKGROUND

1. Technical Field

The present invention relates to a method of manufacturing a semiconductor device capable of improving close adherence of insulating interlayer.

2. Related Art

With the advances in dimensional shrinkage of silicon semiconductor integrated circuit (LSI), it has faced new difficulties in increase in power consumption and signal delay due to increased parasitic capacitance. Decrease in the dielectric constant of the insulating film is therefore indispensable to avoid these problems, and the situation has promoted adoption of porous insulating film. The porous insulating film is generally formed by a method of introducing porogen in the process of film growth, and then removing it typically by post-curing. The method has succeeded in obtaining an insulating interlayer having a dielectric constant of approximately 2.0 to 2.5.

Reduction of the dielectric constant as a result of introduction of pores is, however, causative of degradation in physical characteristics of the film, so that various improvements have been made to avoid the degradation.

For example, for the purpose of improving the inter-film close adherence of a SiCN film/low-k film (SiOC film) stacked structure, Japanese Laid-Open Patent Publication No. 2005-223012 discloses a method of varying flow rate of source material for forming the SiOC film, so as to make the density thereof elevated in a portion closer to the SiCN film, and decreased in a direction departing from SiCN film.

For the purpose of suppressing moisture adsorption of the insulating interlayer, Japanese Laid-Open Patent Publication No. 2007-142066 discloses a method of controlling the rate of growth of the film, making use of a high-frequency power of 13.56 MHz and a low-frequency power of 300 kHz or larger and 500 kHz or smaller.

For the purpose of ensuring a necessary level of reliability, Japanese Laid-Open Patent Publication No. 2005-223012 discloses a method of forming the film making use of high-frequency power and low-frequency power, and terminating the formation while step-wisely turning off these two levels of RF. According to the publication, the number of micro foreign matters on the surface of film may be reduced by turning off a high-frequency power source substantially earlier than a low-frequency power source.

International Patent Publications WO2008/10591 and WO2007/132879 disclose techniques of reducing dielectric constant of an insulating interlayer by introducing micropores in the film, in plasma polymerization using a cyclic monomer, or using a cyclic monomer and straight-chain monomer.

International Patent Publication WO2008/078649 discloses a method of forming a capping film using a barrier insulating film containing an unsaturated hydrocarbon and amorphous carbon, or using a double-layered structure composed of such barrier insulating film and an inner barrier insulating film composed of SiN, SiC, SiCN or the like, to thereby improve the barrier function against diffusion.

Japanese Laid-Open Patent Publication No. 2003-234346 describes a method of forming a barrier insulating film, by supplying high-frequency power to one electrode of a plasma chamber, and by supplying a low-frequency power of 50 kHz or larger and smaller than 1 MHz to the opposite electrode only in an early stage of formation of the film.

SUMMARY

The insulating interlayer is configured by a stack of a plurality of insulating films. For the purpose of improving reliability of semiconductor device, it is necessary to improve close adherence between every adjacent films in the insulating interlayer, as described in Japanese Laid-Open Patent Publication No. 2005-223012. Accordingly, it is preferable that close adherence between every adjacent films may be improved also by a method other than that described in Japanese Laid-Open Patent Publication No. 2005-223012.

According to the present invention, there is provided a method of manufacturing a semiconductor device, which includes a process of forming at least one insulating film, which composes an insulating interlayer, by plasma polymerization or plasma CVD.

The method is configured to modulate, in the process of forming the insulating film, characteristics of the film grown on a substrate in the thickness-wise direction, by varying the ratio of high-frequency input and low-frequency input used for inducing plasma in the course of forming the insulating film.

According to the present invention, there is also provided a method of manufacturing a semiconductor device, which includes a process of forming at least one insulating layer, which composes an insulating interlayer, by plasma polymerization or plasma CVD.

The method is configured to apply, in the process of forming the insulating film, high-frequency input and low-frequency input for inducing plasma from a single electrode, while elevating the level of the low-frequency input at least either at the start of formation or at the end of formation of the insulating film, as compared with the input level in the residual time zone.

According to these methods of manufacturing a semiconductor device, characteristics of a film grown on a substrate may be modulated in the thickness-wise direction, by varying the ratio of high-frequency input and low-frequency input used for inducing plasma. Accordingly, by controlling mode of the modulation, an insulating interlayer excellent in the close adherence may be formed, while keeping the dielectric constant at a low level.

According to the present invention, an insulating interlayer excellent in close adherence may be formed, while keeping the dielectric constant at a low lever.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 2A and 2B are drawings illustrating an exemplary process sequence of formation of insulating interlayer according to the first embodiment;

FIG. 15 is a drawing illustrating changes in characteristics of the insulating interlayer in the thickness-wise direction according to the third embodiment;

FIGS. 17A and 17B are drawings illustrating states of distribution of electrons and ions in the vicinity of wafer surface under application of high-frequency input and low-frequency input;

DETAILED DESCRIPTION

Figure 1:
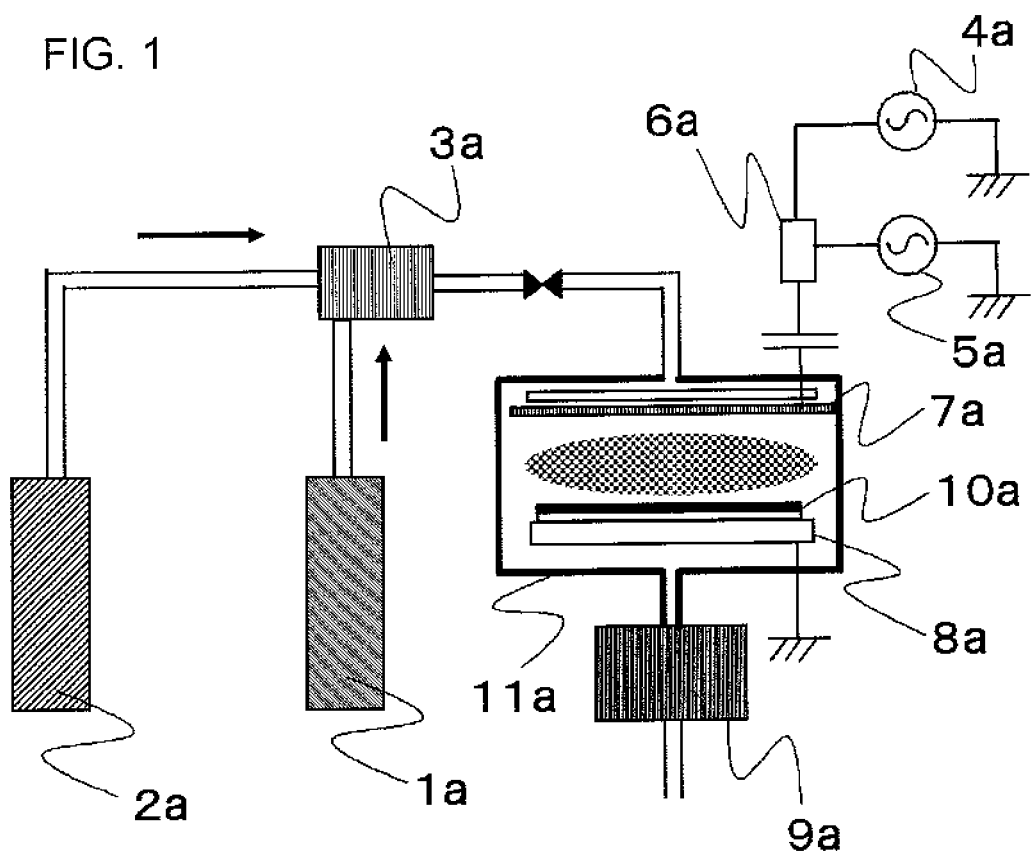
FIG. 1 is a drawing illustrating an exemplary configuration of an apparatus for forming insulating interlayer according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiment of the present invention will be explained below, referring to the attached drawings. Note that all similar constituents in all drawings will be given similar reference numerals or symbols, so as to appropriately avoid repetitive explanation.

First, terminology in the embodiments and Examples below will be explained.

Low-k insulating film typically means a film (insulating interlayer) for electrically isolating interconnects, having a dielectric constant smaller than that of silicon oxide film (dielectric constant=4.2) in view of reducing parasitic capacitance in a multi-layered interconnect used for connecting semiconductor elements. In particular, porous insulating film, which is a representative of the low-k insulating film, may be exemplified by a material obtained by introducing pores into silicon oxide film to thereby reduce the dielectric constant; and materials obtained by introducing pores into HSQ (hydrogen silsesquioxane) film, SiOCH, SiOC (for example, Black Diamond, CORAL, Aurora, all of which are trade names), and so forth, to thereby reduce the dielectric constant.

Metal interconnect material herein contains Cu as a major constituent (typically 95% or more on the weight basis). For the purpose of improving the reliability, the metal interconnect material may be configured so that a member composed of Cu may contain a metal element other than Cu, or a member composed of Cu may have a metal element other than Cu deposited on the top surface or side faces thereof.

Damascene interconnect herein means a buried interconnect formed by filling trenches, preliminarily formed in an insulating interlayer, with a metal interconnect material, and then removing the excessive portion of the metal deposited outside the trenches typically by CMP (Chemical Mechanical Polishing). In the process of forming the damascene interconnect using Cu, it is general to adopt a structure in which the side faces and outer circumference of the Cu interconnect is covered with a barrier metal, and the top surface of the Cu interconnect is covered with an insulating barrier film.

CMP process means a method of planarizing irregularities on the surface of wafer produced in the process of forming the multi-layered interconnect, by bringing the wafer into contact with a rotating polishing pad while supplying polishing slurry in between. In the process of forming interconnects based on the damascene process, the CMP process is used particularly for the purpose of removing an excessive metal portion after the metal is filled in interconnect trenches or via holes, to thereby obtain flat surface of the interconnects.

Barrier metal is an electro-conductive film having barrier performance, provided so as to cover the side faces and bottom of the interconnects, aimed at preventing a metal element composing the interconnects from diffusing into insulating interlayer and lower layers. For an exemplary case where the interconnect contains Cu as a major metal element, the barrier metal adoptable thereto may be composed of refractory metals or nitrides of them, such as tantalum (Ta), tantalum nitride (TaN), titanium nitride (TiN), tungsten carbonitride (WCN), or stacked film composed of these materials.

Capping film is a film formed over the top surface of the Cu interconnect, and has a function of preventing oxidation of Cu, preventing diffusion of Cu into the insulating film, and playing a role of an etching stopper film. The capping film is typically configured by SiC film, SiCN film, SiN film, CoWP, CoWB, CoSnP, CoSnB, NiB, NiMoB and so forth.

Semiconductor substrate is a substrate having semiconductor devices configured thereon, and includes not only singlecrystalline silicon substrate, but also SOI (Silicon on Insulator) substrate, and those used for manufacturing TFT (Thin film transistor) panel, liquid crystal display panel, and so forth.

Hard mask is an insulating film formed over the insulating interlayer so as to protect it, for the case where it is difficult to directly polish the insulating film by CMP, due to its lowered strength as a result of reduction in the dielectric constant.

Plasma CVD is a technique of forming a continuous film over a substrate by gas-phase reaction, surface reaction over the substrate and so forth, typically by consecutively supplying gaseous source materials into a reaction chamber kept under reduced pressure, and exciting molecules of the source materials making use of plasma energy.

Plasma polymerization is a technique of forming a continuous film over a substrate typically by polymerization reaction which proceeds over the surface of wafer, typically by consecutively supplying gaseous source materials into a reaction chamber, and exciting molecules of the source materials making use of plasma energy.

Next, the insulating interlayer and the method of forming the same, according to this embodiment of the present invention, will be detailed referring to the attached drawings. FIG. 1 is a film-forming apparatus for forming insulating interlayer, according to the first embodiment. A source material reservoir 1a is a component for storing a liquid source material for forming the insulating interlayer. A carrier gas supply unit 2a is a component for supplying an inert gas used for carrying (diluting) the source gas, from which one or more species which belong to Group 0, exemplified by argon, helium and so forth, are supplied. Helium gas is particularly preferable as the inert gas adoptable herein. In plasma CVD or plasma polymerization, the final rate of growth and quality of the film are determined by the amount of increase of the film by the contribution of adsorption or polymerization over the surface of the semiconductor substrate, and amount of removal of the film by the contribution of heat and sputtering. The process of removal may be suppressed by using a light carrier gas, and thereby the rate of film growth may be increased.

A gasifier 3a is a component for gasifying the liquid source material supplied from the source material reservoir 1a. The gasified liquid source material is carried through a pipe together with the inert gas supplied from the carrier gas supply unit 2a. A high-frequency power source 4a is a device for supplying power in the process of generating plasma, and oscillates at 13.56 MHz or multiple frequencies thereof. A low-frequency power source 5a is a device for supplying power in the process of generating plasma, and oscillates at 300 to 500 kHz. A matching box 6a is a component for ensuring impedance matching of circuit when the high-frequency power source 4a and the low-frequency power source 5a oscillate, and is mainly composed of capacitor and coil. An upper electrode 7a is a component for radiating electric power supplied from the high-frequency power source 4a and the low-frequency power source 5a. A lower electrode 8a is a component grounded in the process of generating plasma. A wafer 10, which is a semiconductor substrate, is placed on the lower electrode 8a. A vacuum pump 9a is a device for evacuating a reactor 11a. A dry pump is often adopted as the vacuum pump 9a. The wafer 10a serves as a substrate for manufacturing the semiconductor device, and is composed of silicon, or compound semiconductor such as GaAs. The reactor 11a is a vacuum chamber in which film growth by CVD or plasma polymerization is allowed to proceed, and has the upper electrode 7a and the lower electrode 8a provided therein.

Figure 3:
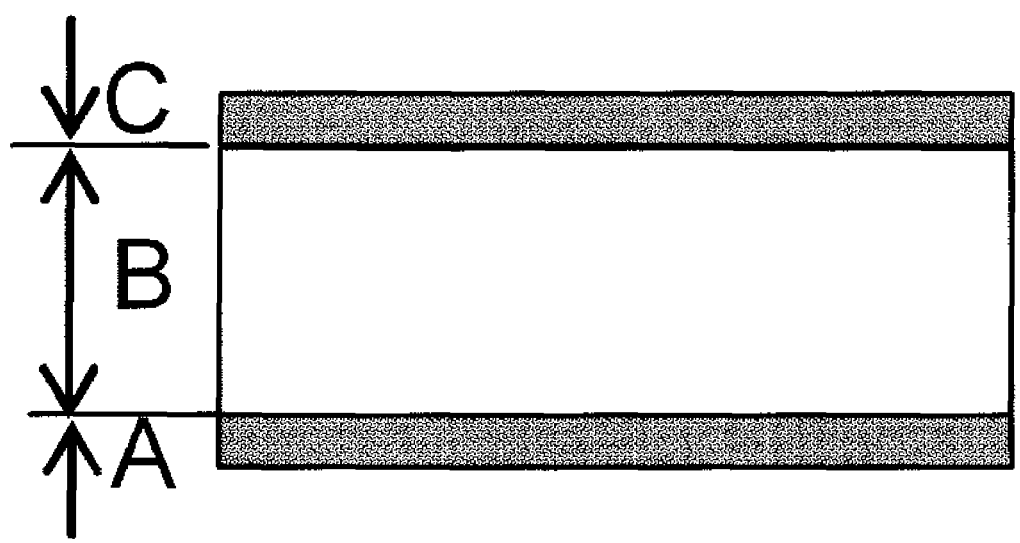
FIG. 3 is a sectional view illustrating the insulating interlayer according to the first embodiment.

Examples of process sequence of formation of the insulating interlayer are illustrated in FIGS. 2A and 2B, and a cross sectional structure of the obtained film is illustrated in FIG. 3. In the process sequence of formation of the insulating interlayer, characteristics of the film grown over the wafer 10a are modulated in the thickness-wise direction, by varying the ratio of high-frequency input and low-frequency input used for inducing plasma. More specifically, the level of low-frequency input is elevated at least either at the start of formation or at the end of formation of the insulating film, as compared with the input level in the residual time zone. Details will be given below.

Upon confirming that an atmosphere in the reactor 11a, having the source gas and the carrier gas introduced therein, is satisfied, two levels of frequency of input, which are high-frequency (HRF) input and low-frequency (LRF) input, are given to the upper electrode 7a. This induces plasma, and the film formation begins. The film formation in time zone A, illustrated in FIG. 3, proceeds. Next, the LRF input is interrupted (FIG. 2A), and the film formation is continued over time zone B, illustrated in FIG. 3, only under the HRF input. Alternatively, the film formation is continued over time zone B, illustrated in FIG. 3, while lowering the level of LRF (FIG. 2B). The LRF output may be zeroed or lowered also by ramping, by which the output is gradually reduced (not illustrated). The ramping in the context herein means a method of varying the output up to a desired value at a predetermined rate. A typical ramping for reducing the LRF output may be exemplified by a method of lowering the LRF output at a rate of 1 to 100 W/sec, finally down to 0 W.

After the formation proceeded over an arbitrary duration, the LRF output is elevated again, and the film formation is continued over time zone C, illustrated in FIG. 3, under both of the HRF input and LRF input. The LRF output may be turned ON also by ramping, by which the output is gradually increased (not illustrated).

Note that time zones A, B and C illustrated in FIG. 3 respectively correspond to a lower close-adhesion layer 25a, a low-k insulating film 24a, and an upper close-adhesion layer 26a described later referring to FIG. 6A-6J.

Figure 4:
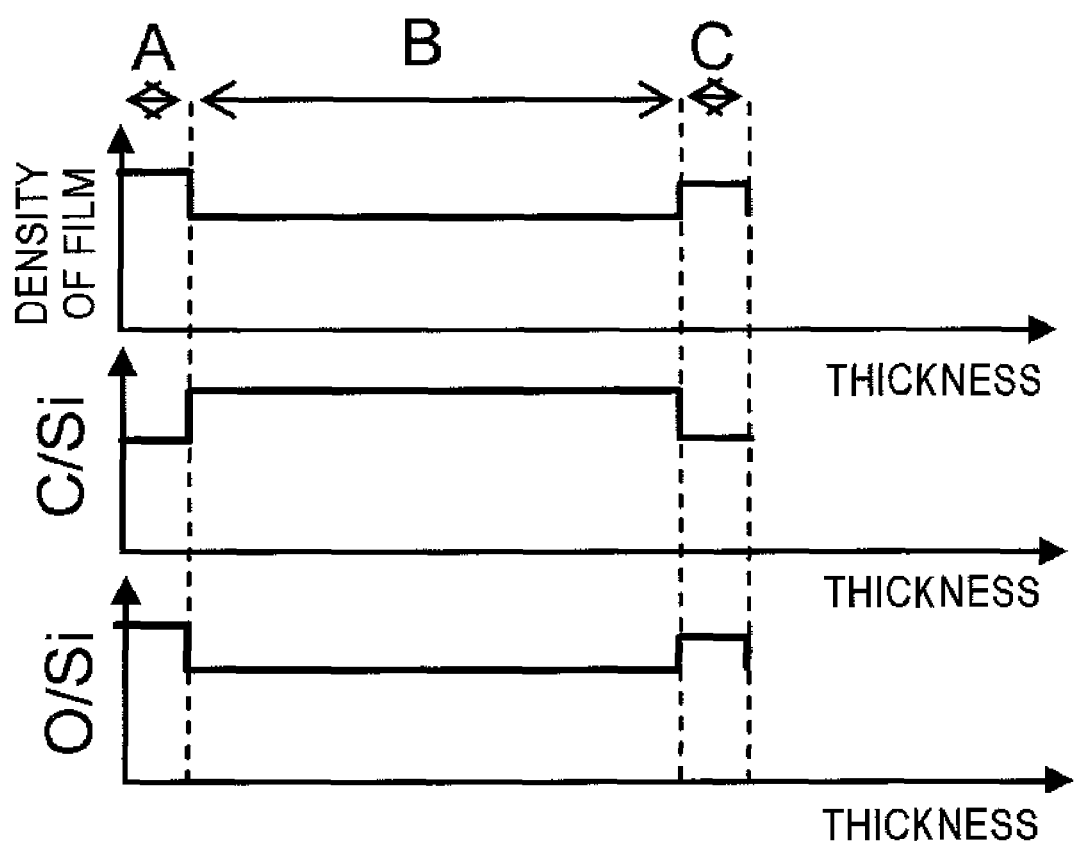
FIG. 4 is a drawing illustrating changes in characteristics of the insulating interlayer in the thickness-wise direction according to the first embodiment.

FIG. 4 illustrates changes of thickness direction in density, carbon concentration (atomic ratio) relative to silicon, and oxygen concentration (atomic ratio) relative to silicon, of the insulating interlayer formed by the method according to the embodiment. The density of the film was determined by small-angle X-ray scattering, and the carbon concentration and oxygen concentration relative to silicon were determined by XPS (X-ray photoelectron spectroscopy). The film was confirmed to have an increased density, an increased oxygen concentration, and a decreased carbon concentration, in regions A and C illustrated in FIG. 3, as compared with region B.

According to the method described in the above, the low-k insulating film may be formed between the close-adhesion layers, and thereby the insulating interlayer excellent in close adherence may be formed, while keeping the dielectric constant at a low level.

(First Embodiment)

Figure 5:
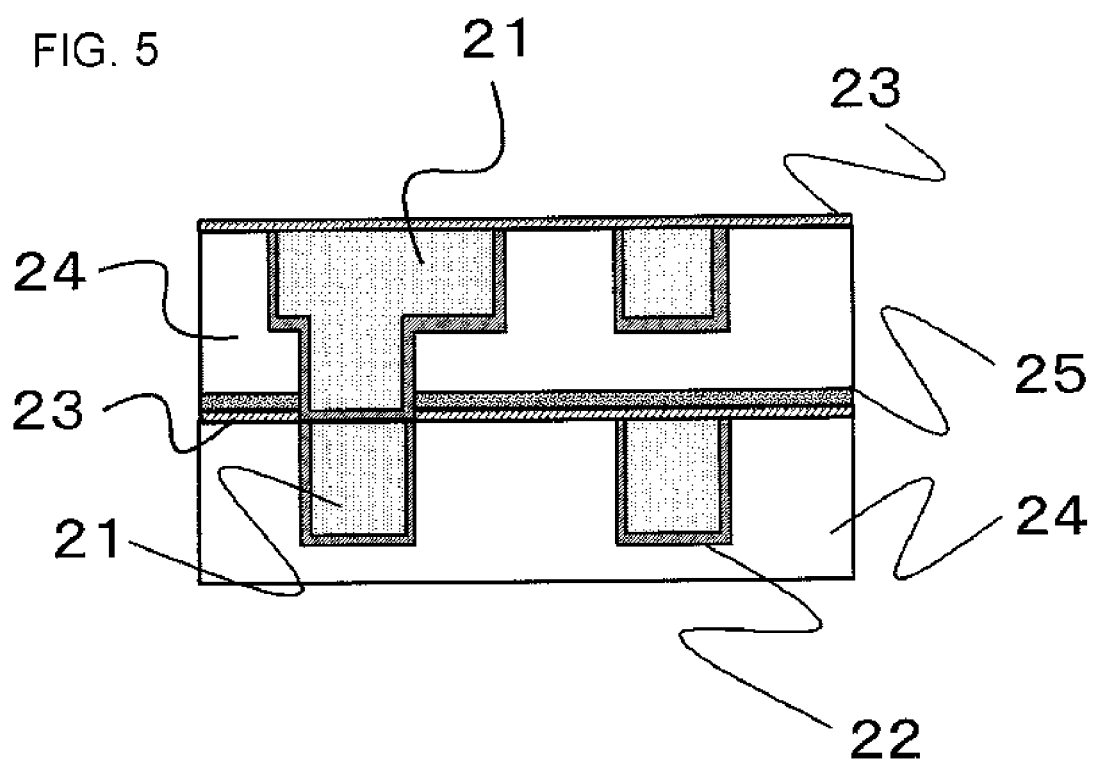
FIG. 5 is a drawing illustrating an exemplary cross section of a semiconductor device according to the first embodiment.

FIG. 5 is a drawing illustrating an exemplary cross section of a metal interconnect structure according to a first embodiment. A metal interconnect material 21 is aimed at electrically connecting elements in the semiconductor device, and is buried in the surficial portion of a low-k insulating film 24. A barrier metal film 22 is a metal film for preventing the metal interconnect material 21 from diffusing into the insulating interlayer 24. Also a capping film 23 is a film aimed at preventing the metal interconnect material 21 from diffusing.

The low-k insulating film 24 is an insulating film for filling up spaces between every adjacent vias and interconnects. A close-adhesion layer 25 is a layer aimed at improving close adherence of the low-k insulating film 24 with both of layers thereabove and therebelow, or with either of layers thereabove and therebelow. The metal interconnect structure illustrated in FIG. 5 is obtained by stacking a plurality of layered structure composed of the capping film 23, the close-adhesion layer 25, the low-k insulating film 24 and the metal interconnect material 21.

Figure 6A:
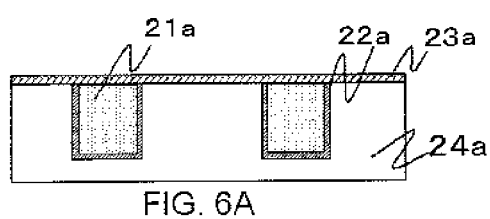
FIGS. 6A to 6J are drawings illustrating an exemplary method of manufacturing a semiconductor device according to the first embodiment.
Figure 6F:
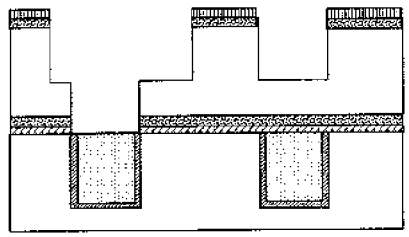
Figure 6B:
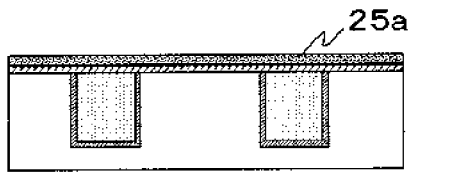
Figure 6G:
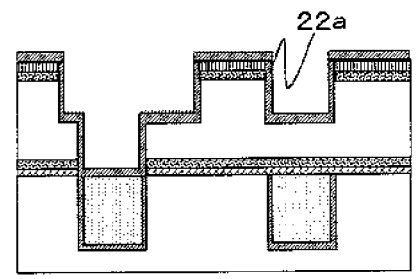
Figure 6C:
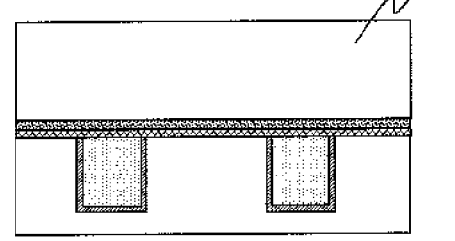
Figure 6D:
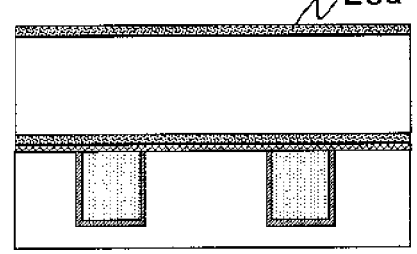

FIGS. 6A to 6J are drawings illustrating a method of manufacturing the metal interconnect structure illustrated in FIG. 5. FIG. 6A illustrates a lower interconnect over which an upper interconnect is formed. Also the lower interconnect portion may be formed by a process similar to that for forming the upper layer described below. After the layer structure of the lower interconnect was formed, the lower close-adhesion layer 25a is formed by plasma CVD or plasma polymerization reaction (FIG. 6B). The lower close-adhesion layer 25a is formed using both of high-frequency input and low-frequency input. Thereafter, the low-frequency input is turned OFF, and the film formation is continued using only the high-frequency input, to thereby deposit the low-k insulating film 24a (FIG. 6C). Next, the low-frequency input is turned ON again, and the film formation is continued to thereby form the upper close-adhesion layer 26a (FIG. 6D).

Figure 6H:
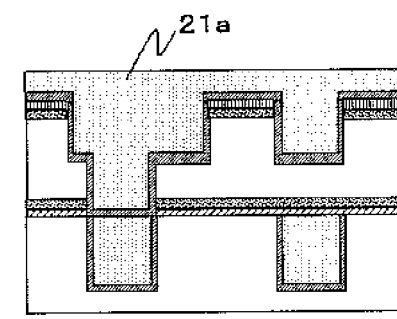
Figure 6E:
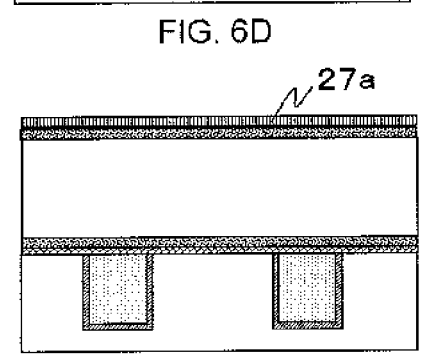

Next, the hard mask 27a is formed. The hard mask 27a serves as a protective film for the low-k insulating film 24a in the process of CMP (FIG. 6E). The hard mask 27a may be composed of $SiO_2$ film, TEOS film, or may be relatively-hard (having a modulus of 10 GPa or above) SiOC film or SiOCH film. Next, a resist pattern is formed thereon, and anisotropic etching is carried out using the resist pattern as a mask, to thereby form interconnect trenches and connection holes in the insulating film (FIG. 6F). The resist pattern is then removed, a barrier metal film 22a is formed over the entire surface (FIG. 6G), and the interconnect trenches and the connection holes are filled with a metal interconnect material 21a composed of Cu (FIG. 6H).

Figure 6I:
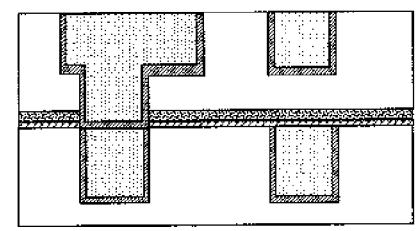
Figure 6J:
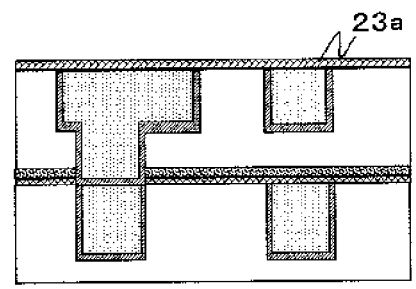

Next, the product is subjected to annealing for allowing Cu grains to grow. Temperature of the annealing herein is adjusted to 200° C. to 400° C., and the length of time is adjusted to 30 seconds to one hour. Excessive portions of the metal interconnect material 21a and the barrier metal film 22, which are grown on the outside of the interconnect trenches and connection holes, and the hard mask 27a and the upper close-adhesion layer 26 are then removed by a polishing technique such as CMP (FIG. 6I). In this process, the upper close-adhesion layer 26 and the hard mask 27a may completely be removed (FIG. 6I), or parts of the upper close-adhesion layer 26 and the hard mask 27a may be remained unremoved (FIG. 2I). A capping film 23a is then formed (FIG. 6J). By repeating the processes illustrated in FIGS. 6A to 6I, interconnects in upper layers may be formed. While the description in the above dealt with the dual-damascene process by which the interconnect trenches and the connection holes are concurrently formed, the present invention may be adoptable also to formation of the interconnect layers making use of single-damascene process.

A source monomer of the lower close-adhesion layer 25a, he low-k insulating film 24, and the upper close-adhesion layer 26a is preferably a cyclic organosilica compound typically represented by Formula (3) below, where each of R1 and R2 presents an unsaturated hydrocarbon group or saturated hydrocarbon group. At least either one of R1 and R2 may contain any one of vinyl group, allyl group, methyl group, ethyl group, propyl group, isopropyl group, and butyl group.

[Chemical Formula 1]

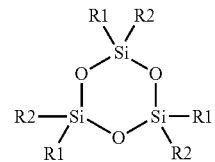

Formula (3)

The cyclic organosilica compound typically has a structure represented by any one of the formulae 4, 5 and 6.

[Chemical Formula 2]

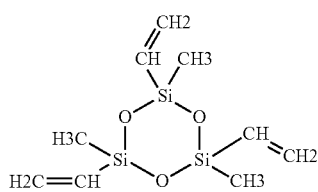

Formula (4)

[Chemical Formula 3]

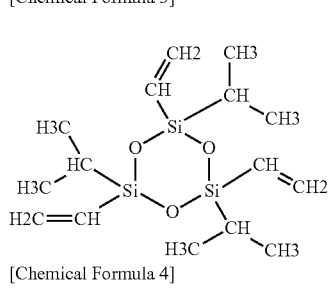

Formula (5)

[Chemical Formula 4]

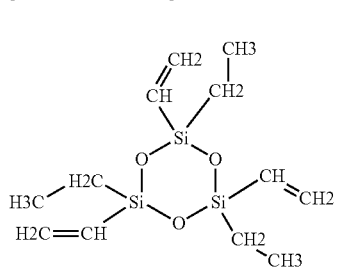

Formula (6)

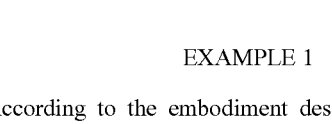

EXAMPLE 1

According to the embodiment described in the above, improvement in the reliability as a result of introduction of the lower close-adhesion layer 25a and the upper close-adhesion layer 26a was confirmed. The reliability was evaluated based on adhesion strength between the adjacent insulating interlayers. The adhesion strength was measured by peeling test using Scotch tape, and by m-ELT (modified Edge Lift-off Test). In the peeling test, the measurement area was cut crosswise to produce one hundred 1-mm squares aligned in a form of 10×10 matrix, an adhesive tape was placed thereon and then removed, and the number of peeled-off squares was counted. In m-ELT, an epoxy resin was coated over the surface of the sample to an arbitrary thickness, the sample was then cut into an 1-cm square piece, and the piece was cooled with liquid nitrogen. The piece was observed during the cooling, and the adhesion strength was determined based on temperature at which peeling starts, and thickness of the epoxy resin.

The adhesion strength was evaluated in correlation with LRF (W)/HRF (W), which represents ratio of low-frequency (HRF) input and high-frequency (HRF) input in the process of forming the lower close-adhesion layer 25a and the upper close-adhesion layer 26a. In the peeling test, samples found to cause peeling in all of one hundred 1-mm squares were represented by ×, those found to cause peeling in 1 to 99 squares were represented by Δ, and those found to cause no peeling in all of 100 squares were represented by ○. Results are shown in Table 1.

TABLE 1

| | LRF (W)/HRD (W) | | | | | | | | | |
|---|---|---|---|---|---|---|---|---|---|---|
| | 0 | 0.05 | 0.1 | 0.15 | 0.2 | 0.25 | 0.3 | 0.5 | 0.75 | 1 |
| Peeling test | X | Δ | ○ | ○ | ○ | ○ | ○ | ○ | ○ | ○ |
| m-ELT (relative strength) | 1 | 1.2 | 1.5 | 1.6 | 1.7 | 1.8 | 1.8 | 1.85 | 1.85 | 1.85 |

Figure 7:
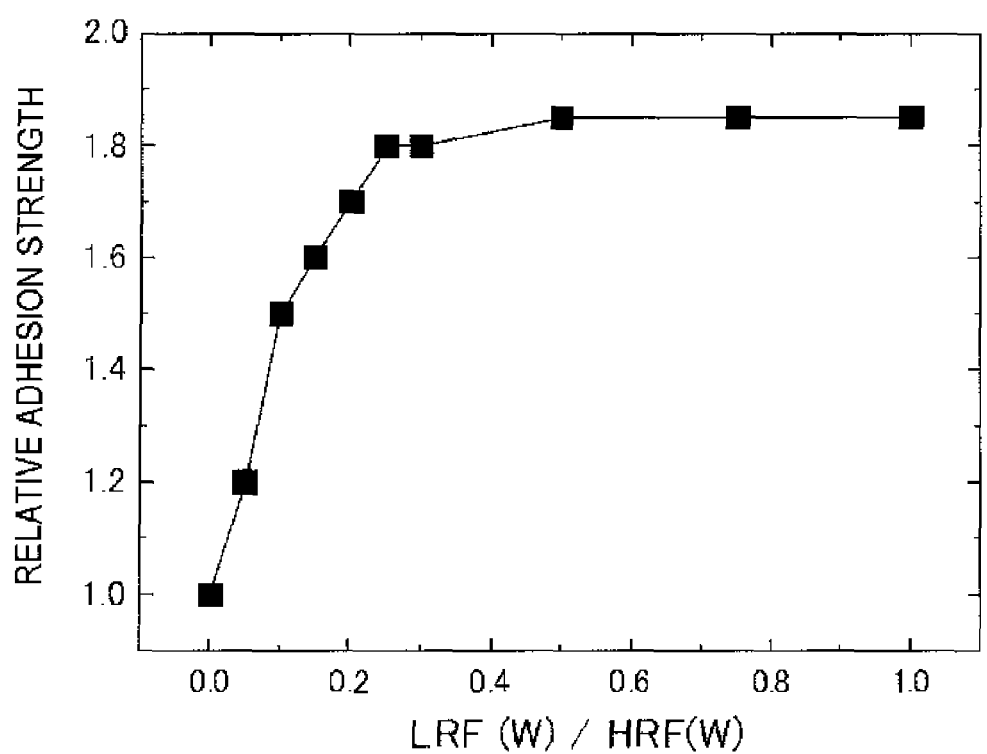
FIG. 7 is a drawing illustrating relations between relative adhesion strength and (low-frequency output)/(high-frequency output) in the process of forming a close-adhesion layer, in the insulating interlayer according to the first embodiment.

From the results, it was made clear in the peeling test that the peeling was not observed if LRF (W)/HRF (W) is 0.1 or larger, and it was also made clear in m-ELT that relative strength as large as 1.5 times or more of the strength observed when the low-frequency input is not used (LRF (W)/HRF (W)=0) may be obtained, if the relation of LRF (W)/HRF (W)≧0.1 is satisfied (FIG. 7). So far as the relation of LRF (W)/HRF (W)≧0.1 is satisfied, the LRF output at the start of film formation and LRF output at the end of film formation may be different. Note that the output in the context herein means electric power radiated from the electrode, and is different from the electric power radiated from the power source.

EXAMPLE 2

Conforming to the embodiment described in the above, influences of introduction of the lower close-adhesion layer 25a and the upper close-adhesion layer 26a on the effective dielectric constant were evaluated. The lower close-adhesion layer 25a and the upper close-adhesion layer 26a are supposed to have an increased dielectric constant, since they have large density and high oxygen concentration (regions A and C in FIG. 4) and low carbon concentration as illustrated in FIG. 4. Then relations of the ratio of sum of thicknesses of the lower close-adhesion layer 25a and the upper close-adhesion layer 26a, and low-k insulating film with respect to the effective dielectric constant were investigated. The thickness of each film was determined by assuming a level of depth, characterized by an average value of bulk carbon concentration of the low-k insulating film 24 and bulk carbon concentration of each of the lower close-adhesion layer 25a and the upper close-adhesion layer 26a, as the interface between every adjacent layers.

Figure 8:
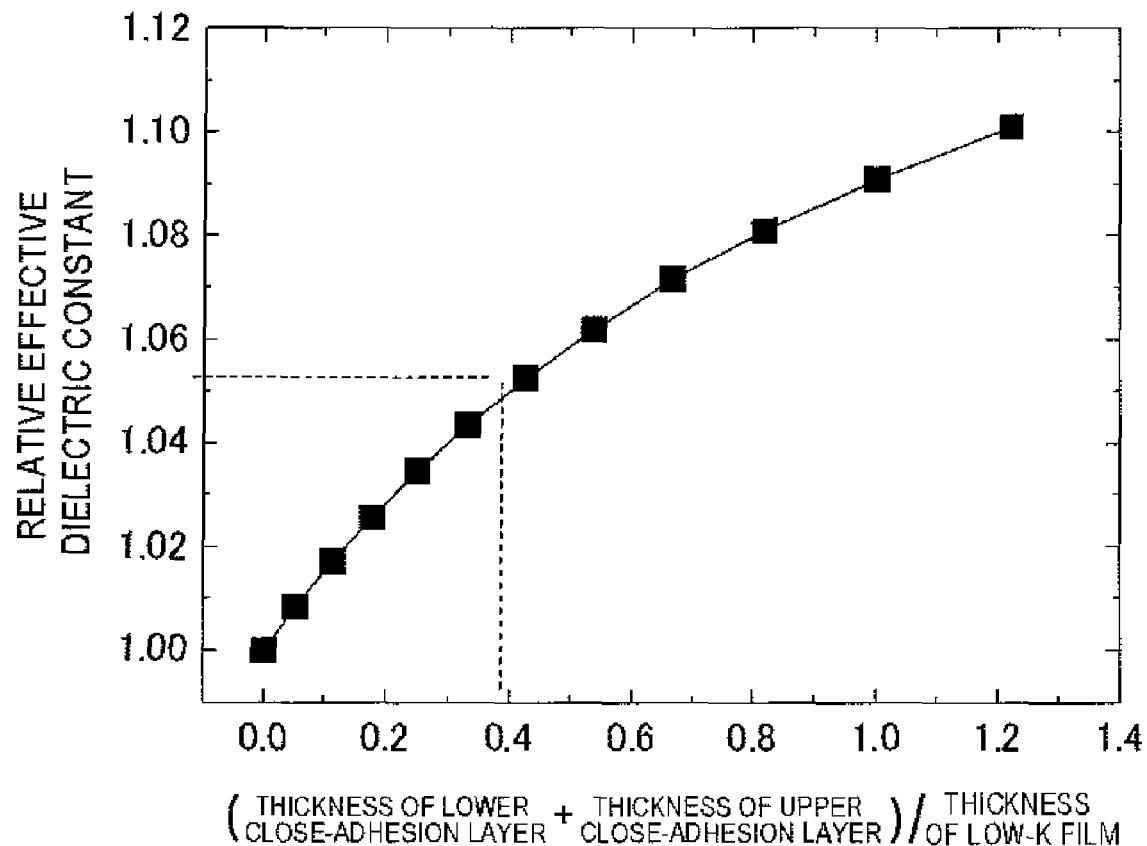
FIG. 8 is a drawing illustrating relations between relative effective dielectric constant and (thicknesses of close-adhesion layers)/(thickness of low-k film) of the insulating interlayer according to the first embodiment.

Results are illustrated in FIG. 8. It was made clear from the drawing that increase in the effective dielectric constant may be suppressed to as small as 5% or less, if ((thickness of lower close-adhesion layer)+(thickness of upper close-adhesion layer))/(thickness of low-k insulating film) is adjusted to 0.4 or smaller.

EXAMPLE 3

Figure 20:
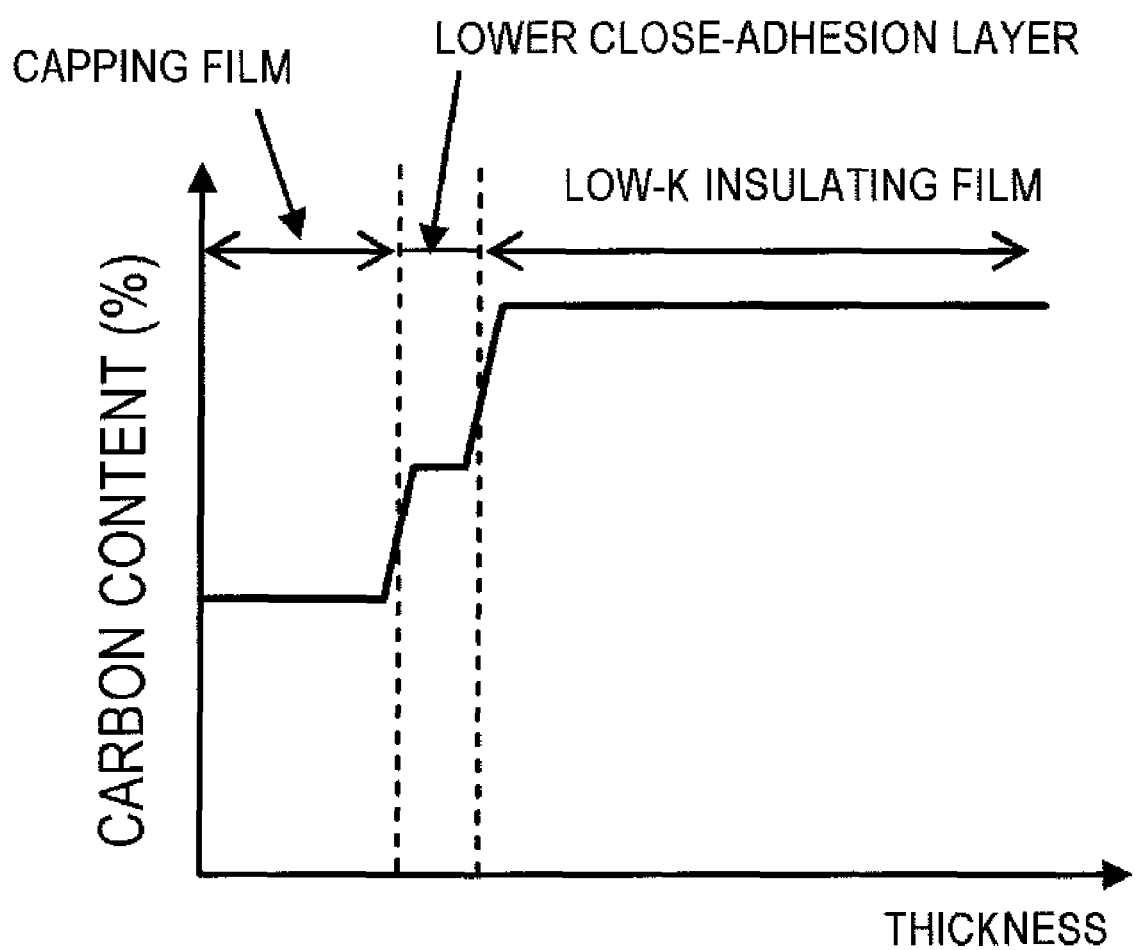
FIG. 20 is a drawing illustrating a profile of carbon concentration in the capping film, the close-adhesion layer and the low-k insulating film.
Figure 21:
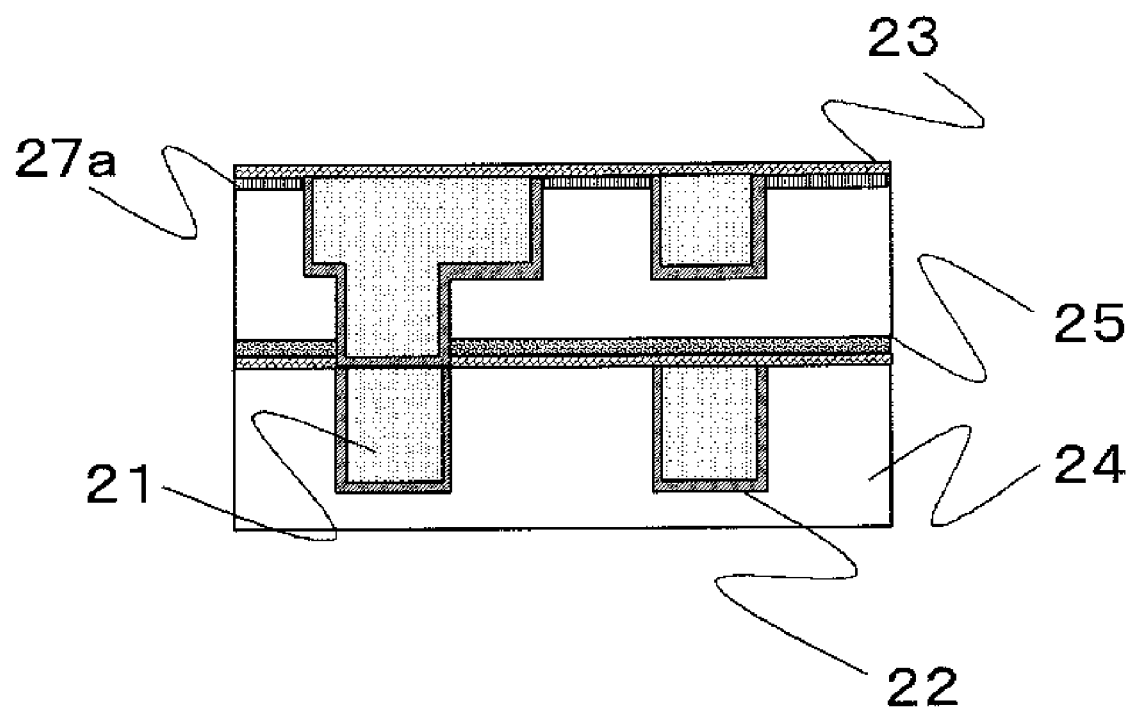
FIG. 21 is a drawing explaining a method of manufacturing a semiconductor device according to the first embodiment.

Relations among the carbon concentrations of the capping film 23a, the lower close-adhesion layer 25a and the low-k insulating film 24a, when the source material represented by Formula (1) was used, were evaluated. A SiCN film was adopted to the capping film 23a, and the lower close-adhesion layer 25a and the low-k insulating film 24a were formed thereon (FIGS. 6A to 6C). Thereafter, the carbon concentrations of the individual films were measured by XPS (X ray photoelectron spectrometry). Results are shown in FIG. 20. Ratio of carbon content in this drawing means atomic ratio of the individual films. From the results, the ratios of carbon content were found to satisfy a relation of capping film<lower close-adhesion layer 25a<low-k insulating film. If the upper close-adhesion layer 26a were not completely removed in the CMP process illustrated in FIG. 6I, the ratios of carbon content would satisfy a relation of capping film<upper and lower close-adhesion layers 25a, 26a<low-k insulating film, indicating that the ratios of carbon content of the upper and lower close-adhesion layers 25a, 26a would have intermediate values between those of the capping film and the low-k insulating film, as a result of increased LRF output.

(Second Embodiment)

Figure 9:
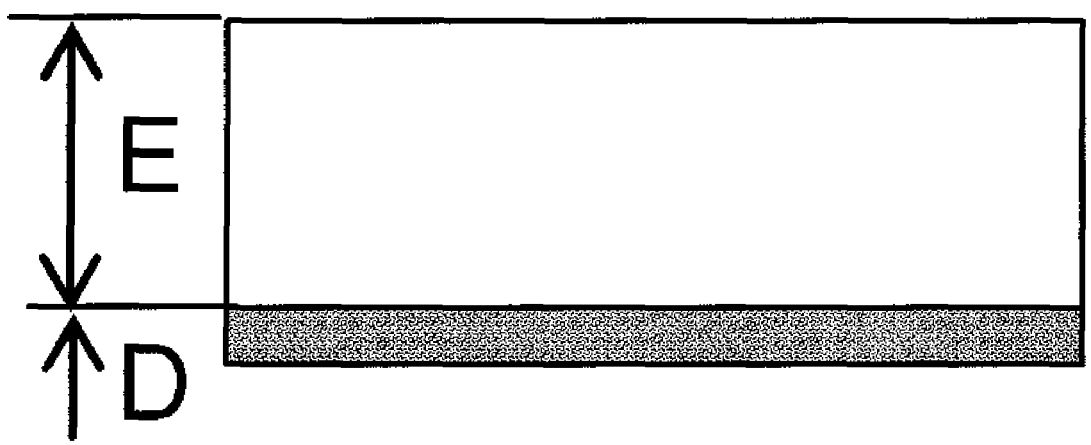
FIG. 9 is a drawing illustrating an exemplary cross section of an insulating interlayer according to a second embodiment.
Figure 10A:
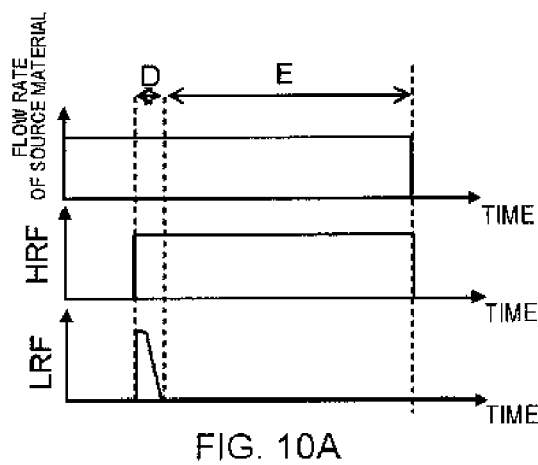
FIGS. 10A and 10B are drawings illustrating an exemplary process sequence of formation of insulating interlayer according to the second embodiment.
Figure 10B:
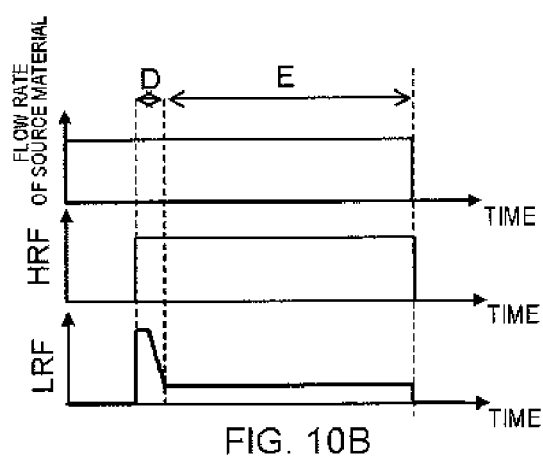
Figure 11:
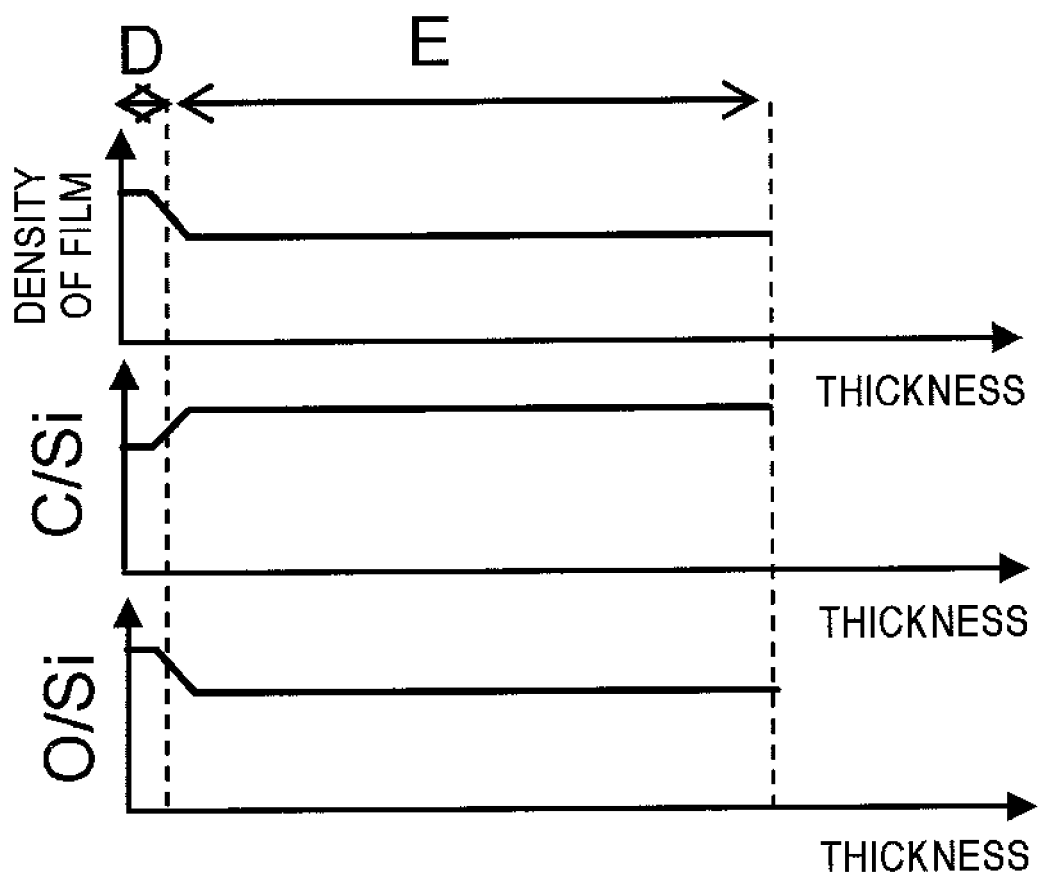
FIG. 11 is a drawing illustrating changes in characteristics of the insulating interlayer in the thickness-wise direction according to the second embodiment.

An insulating interlayer and a method of forming the same according to a second embodiment will be detailed referring to the attached drawings. A cross sectional view of the insulating interlayer according to the second embodiment is illustrated in FIG. 9, and a process sequence of formation of the film is illustrated in FIGS. 10A and 10B. The source gas and the carrier gas are introduced into the reactor and allowed to stabilize, and the film formation is then started by turning on the high-frequency (HRF) input and the low-frequency (LRF) input. Region D illustrated in FIG. 9 is thus formed. Next, the LRF input is turned OFF, and the film formation is continued while being applied only the HRF input (FIG. 10A), to thereby form region E illustrated in FIG. 9. Alternatively, region E illustrated in FIG. 9 is formed by lowering the LRF output (FIG. 10B). The LRF output may be lowered or turned OFF sharply (not illustrated), or by ramping (FIGS. 10A and 10B). FIG. 11 illustrates changes in density, carbon concentration relative to silicon, and oxygen concentration relative to silicon, as viewed in the thickness-wise direction of the insulating interlayer. The density of the film was determined by small-angle X-ray scattering, and the carbon concentration and oxygen concentration relative to silicon were determined by XPS (X-ray photoelectron spectroscopy). The film was confirmed to have an increased density, an increased oxygen concentration, and a decreased carbon concentration in region D illustrated in FIG. 11, as compared with region E. Regions D and E illustrated in FIG. 9 correspond to a lower close-adhesion layer 25b and a low-k insulating film 24b, respectively, illustrated later in FIGS. 12A to 12I.

Figure 12A:
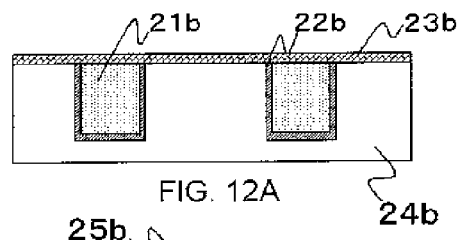
FIG. 12A to 12I are drawings illustrating an exemplary method of manufacturing a semiconductor device according to the second embodiment.
Figure 12B:
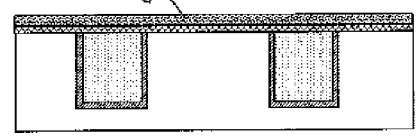
Figure 12C:
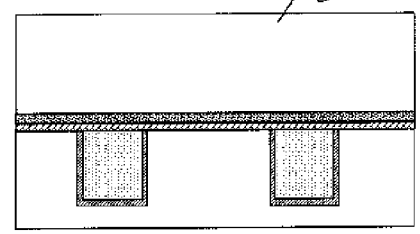

Next, a method of manufacturing will be explained. FIGS. 12A to 12I are sectional views illustrating the method of manufacturing a metal interconnect structure according to the second embodiment. FIG. 12A illustrates a lower interconnect over which an upper interconnect is formed. Also the lower interconnect portion may be formed by a process similar to that for forming the upper layer described below. After the layer structure of the lower interconnect is formed, the lower close-adhesion layer 25b is formed by plasma CVD or plasma polymerization reaction (FIG. 12B). The lower close-adhesion layer 25b is formed using both of high-frequency input and low-frequency input. Thereafter, the low-frequency input is turned OFF, and the low-k insulating film 24b is deposited using only the high-frequency input (FIG. 12C).

Figure 12D:
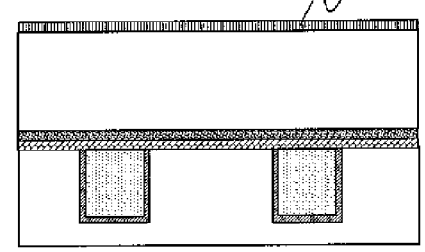
Figure 12E:
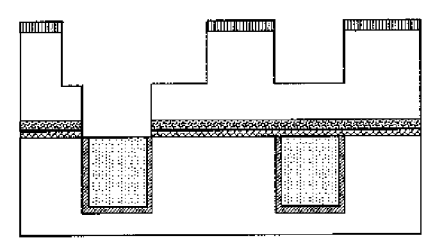
Figure 12F:
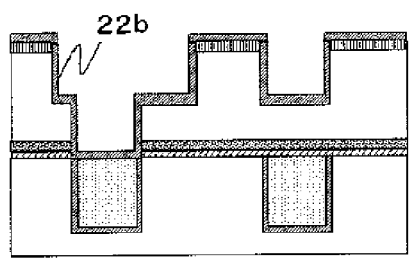
Figure 12G:
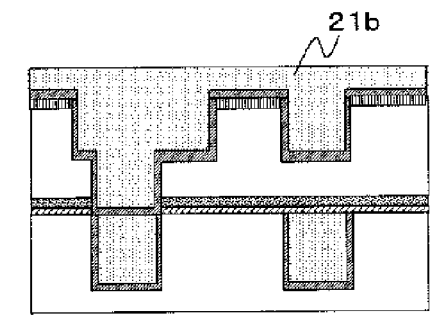

Next, a hard mask 27b, which serves as a protective film for the low-k insulating film 24b in the process of CMP, is formed (FIG. 12D). The hard mask 27b may be composed of $SiO_2$ film, TEOS film, or may be relatively-hard (having a modulus of 10 GPa or above) SiOC film or SiOCH film. Next, the interconnect trenches and the connection holes are formed in the insulating film, by lithography and anisotropic etching (FIG. 12E). A barrier metal film 22b is formed over the entire surface (FIG. 12F), and a metal interconnect material 21b composed of Cu is formed over the entire surface so as to fill the interconnect trenches and the connection holes (FIG. 12G).

Figure 12H:
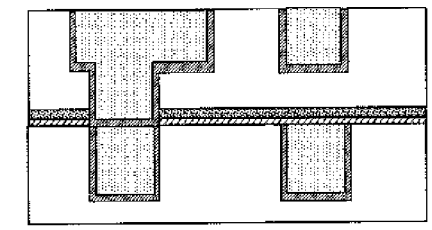
Figure 12I:
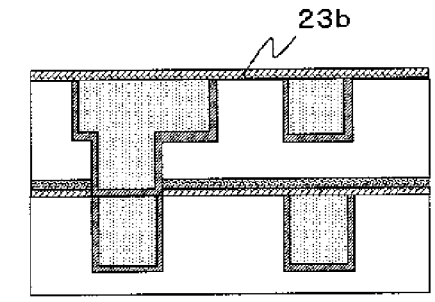
Figure 22:
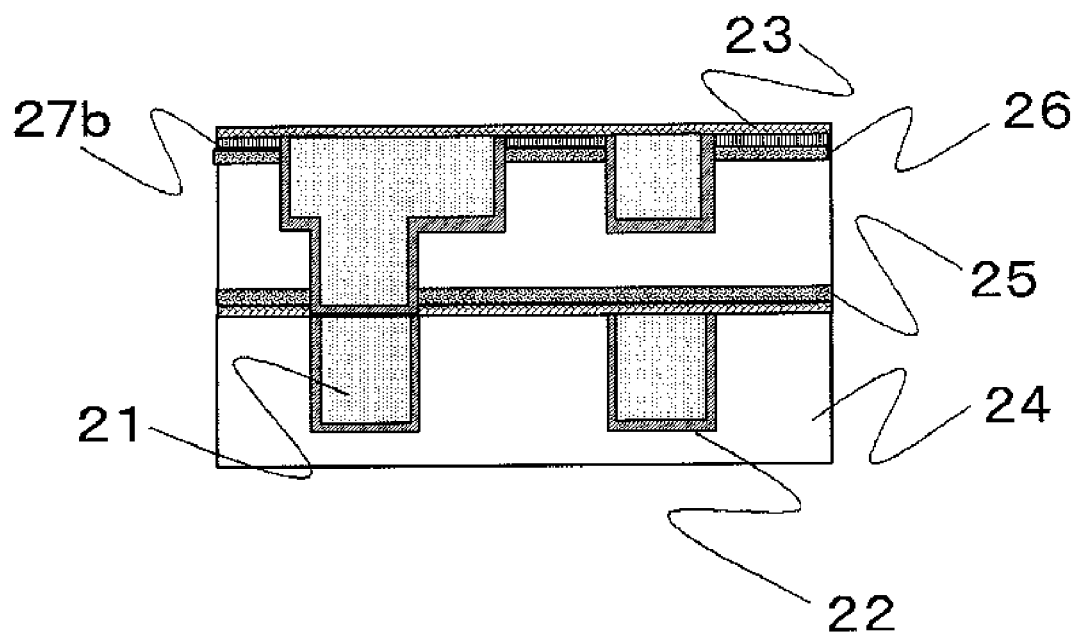
FIG. 22 is a drawing explaining a method of manufacturing a semiconductor device according to the second embodiment.

Next, the product is subjected to annealing for allowing Cu grains to grow. Temperature of the annealing herein is adjusted to 200° C. to 400° C., and the length of time is adjusted to 30 seconds to one hour. Excessive portions of the metal interconnect material 21b and the barrier metal film 22b, which are grown on the outside of the interconnect trenches and connection holes, and the hard mask 27b are then removed by a polishing technique such as CMP (FIG. 12H). In this process, the hard mask 27b may completely be removed, or the whole portion or a part of the hard mask 27b may be remained unremoved (FIG. 22). A capping film 23b is then formed thereon (FIG. 12I). By repeating the processes illustrated in FIGS. 12A to 12I, interconnects in upper layers may be formed. While the description in the above dealt with the dual-damascene process by which the interconnect trenches and the connection holes are concurrently formed, the present invention may be adoptable also to formation of the interconnect layers making use of single-damascene process.

(Third Embodiment)

Figure 13:
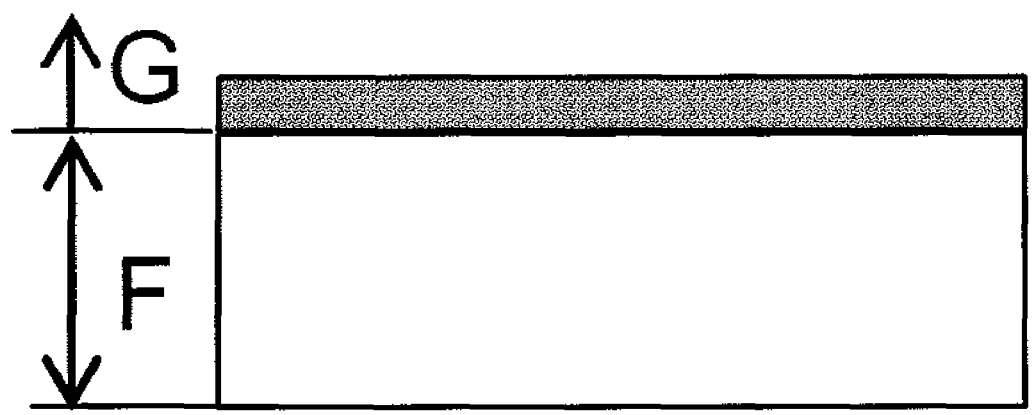
FIG. 13 is a drawing illustrating an exemplary cross section of an insulating interlayer according to a third embodiment.
Figure 14A:
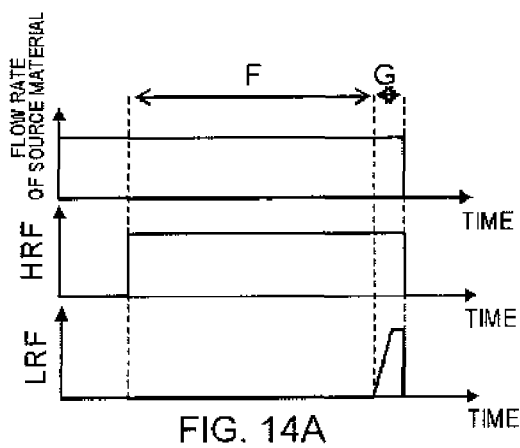
FIGS. 14A and 14B are drawings illustrating an exemplary process sequence of formation of insulating interlayer according to the third embodiment.
Figure 14B:
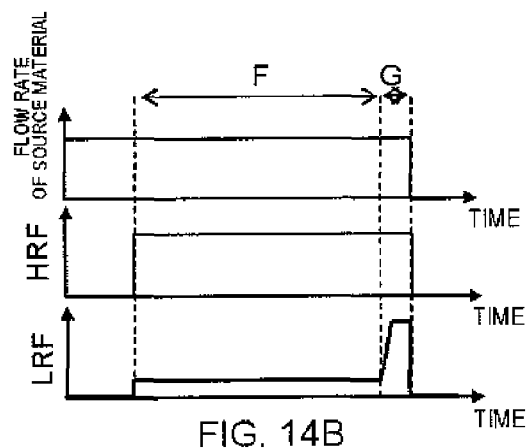

Next, an insulating interlayer and a method of forming the same according to a third embodiment will be detailed referring to the attached drawings. A cross sectional view of the insulating interlayer according to the third embodiment is illustrated in FIG. 13, and examples of process sequence of formation of the film are illustrated in FIGS. 14A and 14B. The source gas and the carrier gas are introduced into the reactor and allowed to stabilize, and the film formation is started by turning on the high-frequency (HRF) input. Alternatively, both of the high-frequency (HRF) input and the low-frequency (LRF) input are turned on to start the film formation. Region G illustrated in FIG. 13 is thus formed. Next, the LRF output is elevated, and thereby region F illustrated in FIG. 13 is formed. The LRF output may be elevated sharply up to an arbitrary level, or by ramping. FIG. 15 illustrates changes in density, carbon concentration relative to silicon, and oxygen concentration relative to silicon, as viewed in the thickness-wise direction of the insulating interlayer. The density of the film was determined by small-angle X-ray scattering, and the carbon concentration and oxygen concentration relative to silicon were determined by XPS (X-ray photoelectron spectroscopy). The film was confirmed to have an increased density, an increased oxygen concentration, and a decreased carbon concentration in region G illustrated in FIG. 13, as compared with region F. Regions F and G illustrated in FIG. 13 correspond to a low-k insulating film 24c and an upper close-adhesion layer 26c, respectively, illustrated later in FIGS. 16A to 16I.

Figure 16A:
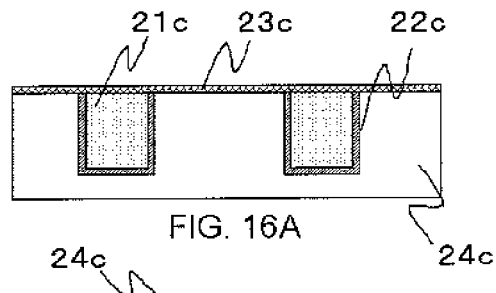
FIGS. 16A to 16I are drawings illustrating an exemplary method of manufacturing a semiconductor device according to the third embodiment.
Figure 16B:
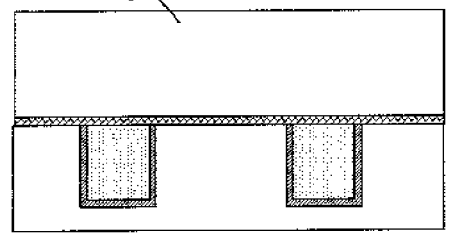
Figure 16C:
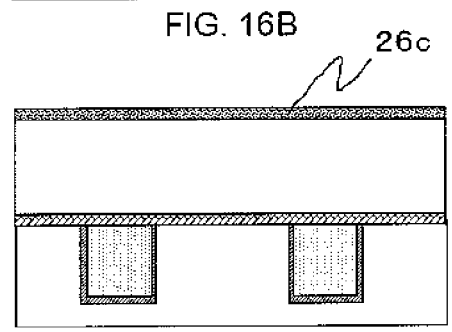

Next, a method of manufacturing will be explained. FIGS. 16A to 16I are sectional views illustrating the method of manufacturing a metal interconnect structure according to the third embodiment. FIG. 16A illustrates a lower interconnect over which an upper interconnect is formed. Also the lower interconnect portion may be formed by a process similar to that for forming the upper layer described below. Next, the low-k insulating film 24c is formed by plasma CVD or plasma polymerization reaction (FIG. 16B). The low-k insulating film 24c is formed using the high-frequency input. Next, the low-frequency input is turned ON, and the upper close-adhesion layer 26c is formed (FIG. 16C).

Figure 16D:
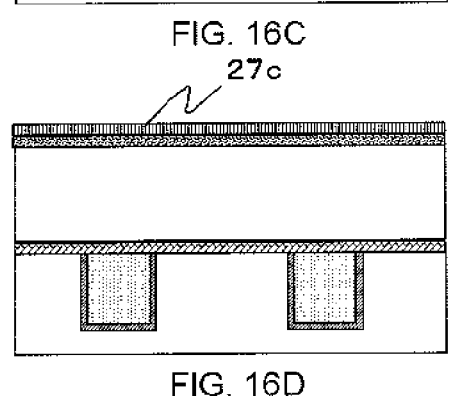
Figure 16E:
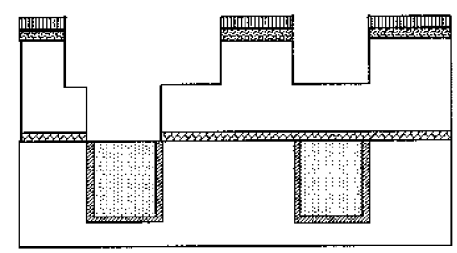
Figure 16F:
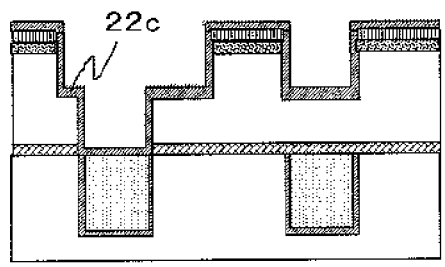
Figure 16G:
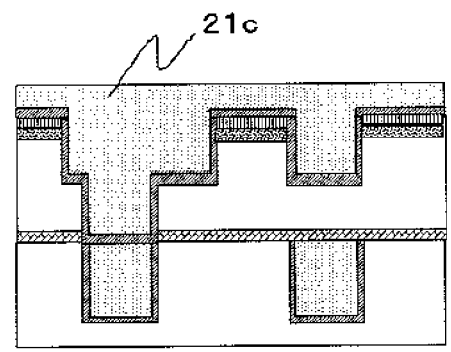

Next, a hard mask 27c, which serves as a protective film for the low-k insulating film 24c in the process of CMP, is formed (FIG. 16D). The hard mask 27c may be composed of $SiO_2$ film, TEOS film, or may be relatively-hard (having a modulus of 10 GPa or above) SiOC film or SiOCH film. Next, the interconnect trenches and the connection holes are formed in the insulating film, by lithography and anisotropic etching (FIG. 16E). A barrier metal film 22c is formed over the entire surface (FIG. 16F), and a metal interconnect material 21c composed of Cu is formed over the entire surface so as to fill the interconnect trenches and the connection holes (FIG. 16G).

Figure 16H:
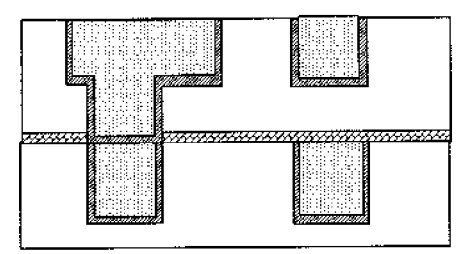
Figure 16I:
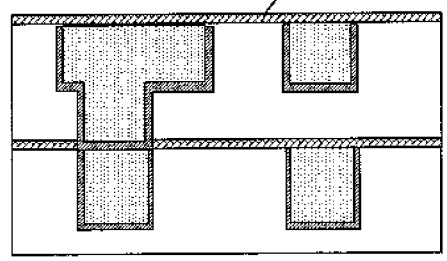
Figure 23:
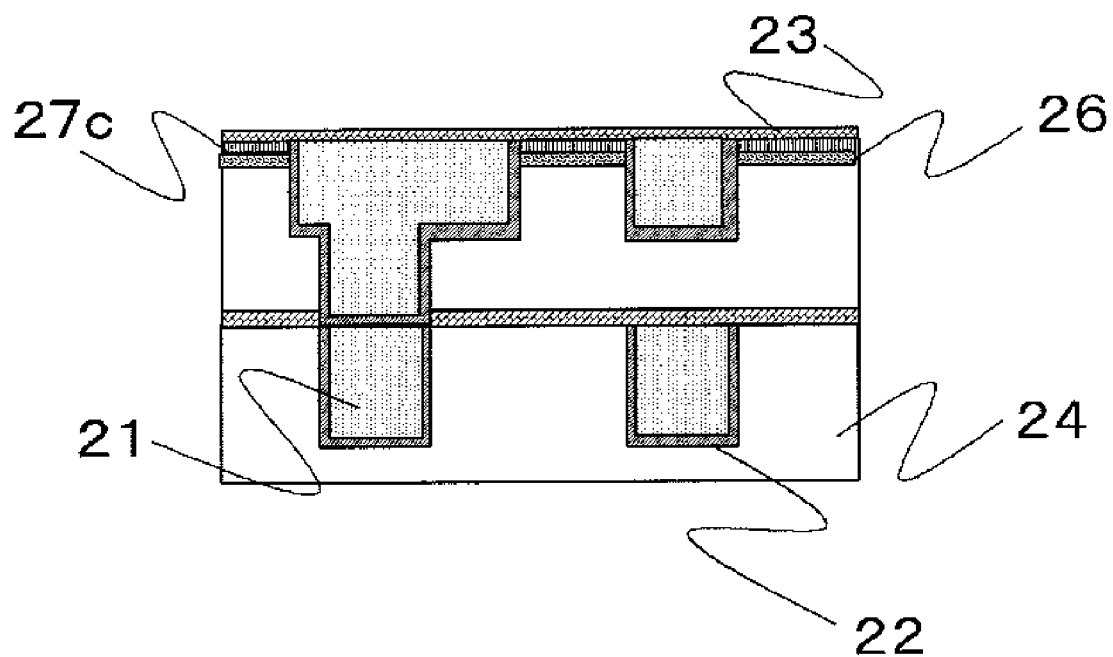
FIG. 23 is a drawing explaining a method of manufacturing a semiconductor device according to the third embodiment.

Next, the product is subjected to annealing for allowing Cu grains to grow. Temperature of the annealing herein is adjusted to 200° C. to 400° C., and the length of time is adjusted to 30 seconds to one hour. Excessive portions of the metal interconnect material 21c and the barrier metal film 22c, which are grown on the outside of the interconnect trenches and connection holes, and the hard mask 27c and the upper close-adhesion layer 26c are then removed by a polishing technique such as CMP (FIG. 16H). In this process, the upper close-adhesion layer 26c and the hard mask 27c may completely be removed by CMP (FIG. 16H), or parts of the upper close-adhesion layer 26c and the hard mask 27c may be remained unremoved (FIG. 23). A capping film 23c is then formed further thereon (FIG. 16I). By repeating the processes illustrated in FIGS. 16A to 16I, interconnects in upper layers may be formed. While the description in the above dealt with the dual-damascene process by which the interconnect trenches and the connection holes are concurrently formed, the present invention may be adoptable also to formation of the interconnect layers making use of single-damascene process.

EXAMPLE 4

Influences of the film formation, possibly exerted on a gate insulating film when the method of forming the insulating interlayer according to any one of the embodiments described in the above is adopted, were evaluated. In the plasma-assisted film formation, stability of the plasma and uniformity of potential distribution may sometimes result in breakdown of the gate insulating film. In a parallel-plate plasma induced by high-frequency input, electrons can comply with a high-frequency inversion of electric field but ions cannot, due to difference in their masses, so that the electrons are abundant in the vicinity of the electrodes, and ions are more abundant in the region more distant from the electrodes (FIG. 17A). As a consequence, the wafer is exposed to abundant electrons which reside in the vicinity of the surface thereof, and is negatively charged by auto-biasing.

Now, by applying the low-frequency input in addition to the high-frequency input, the ions become able to comply with a low-frequency inversion of electric field, and become more abundant in the vicinity of the surface of wafer, as compared with the case applied with the high-frequency input only (FIG. 17B). The wafer is therefore prevented from being negatively charged due to auto-biasing. Accordingly, the influences possibly exerted on the gate insulating film, ascribable to potential distribution, may be suppressed. The influences of application of the low-frequency input, possibly exerted on the gate oxide film, were evaluated using an antenna TEG. Since the antenna TEG is a wafer having test chips formed thereon, and each test chip is formed in the same layer with the gate and has an area larger than that of the gate electrode, so that the plasma-induced damages may be detected in a more sensitive manner. Now, test chips having an electrode area 100,000 times as large as the gate area were used for evaluating breakdown voltage of the gate.

Figure 18:
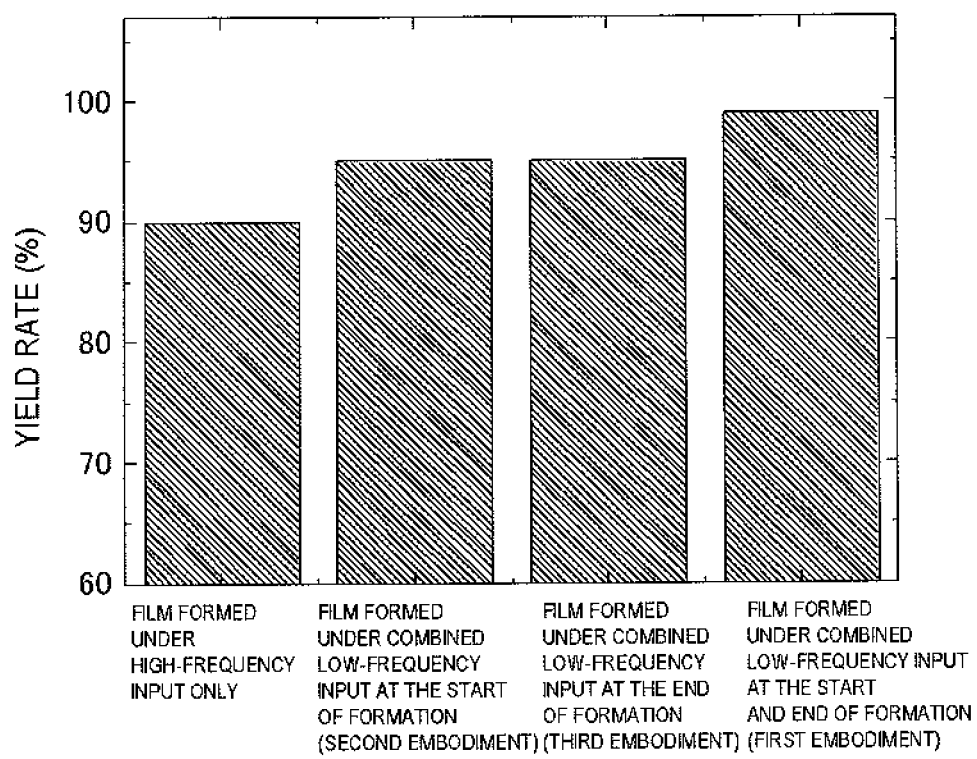
FIG. 18 is a drawing illustrating results of evaluation of plasma damage exerted on the semiconductor devices according to the embodiments.
Figure 19:
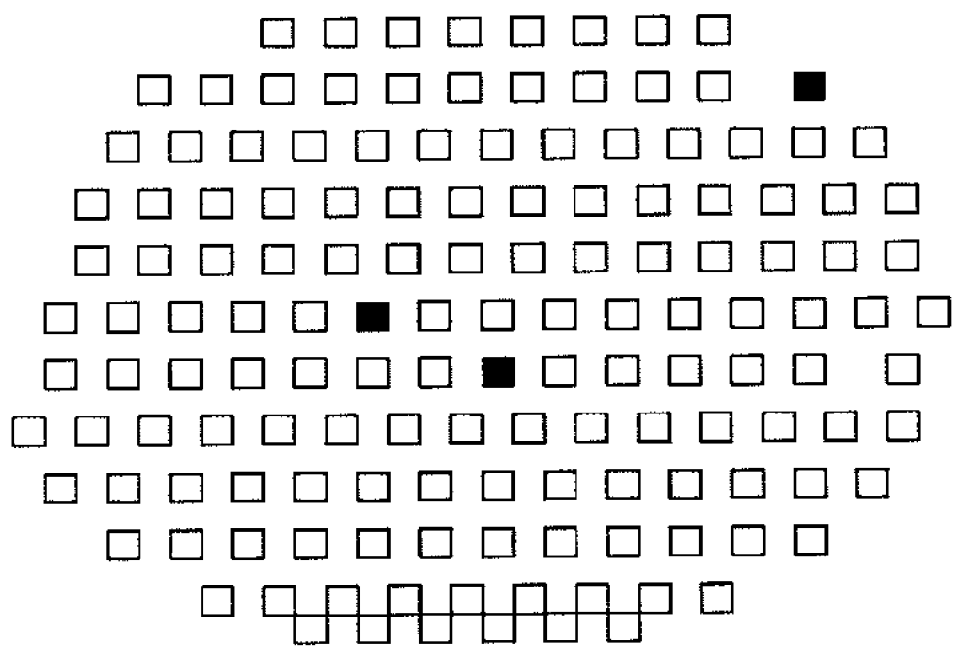
FIG. 19 is a drawing illustrating a distribution of plasma damage exerted on the semiconductor device according to the first embodiment.

First, the breakdown voltage of the gates on the antenna TEG before the film formation was measured. Next, the insulating interlayer was formed on a separate antenna TEG, the breakdown voltage of the gate was measured, and chips which showed breakdown voltage degraded from the level before the insulating interlayer was formed were judged to be unacceptable. FIG. 18 illustrates yield rates of the antenna TEGs having the insulating interlayers formed thereon, while being applied only with the high-frequency input, and while adopting the individual embodiments. It was found that the individual embodiments, under application of the low-frequency input, successfully improved the yield rates of the chips causing no breakdown of the gate insulating film, as compared with the case where the film formation was proceeded under the high-frequency input only. FIG. 19 illustrates an exemplary in-wafer distribution of acceptable/unacceptable chips on the antenna TEG to which the first embodiment was adopted.

The embodiments and Examples of the present invention have been described referring to the attached drawings, merely for exemplary purposes, while allowing adoption of various configurations other than those described in the above.

It is apparent that the present invention is not limited to the above embodiments, that may be modified and changed without departing from the scope and spirit of the invention.

What is claimed is:

1. A method of manufacturing a semiconductor device, comprising a process of forming at least one insulating film, which composes an insulating interlayer, by plasma polymerization or plasma CVD,
said method being configured:
to modulate, in the process of forming said insulating film, characteristics of the film grown on a substrate in the thickness-wise direction, by varying the ratio of high-frequency input and low-frequency input used for inducing plasma.

2. The method of manufacturing a semiconductor device according to claim 1,
wherein said insulating film is formed to have a close-adhesion layer in at least either one of the end portions of the film in the thickness-wise direction, by the contribution of both of the high-frequency input and the low-frequency input, and to have a low-k insulating film in the residual portion of the film, by lowering or zeroing the level of the low-frequency input.

3. The method of manufacturing a semiconductor device according to claim 2,
wherein, in said insulating film, the thickness of said low-k insulating film, and the thickness of said close-adhesion layer which resides on at least either one of the upper and lower sides of said low-k insulating film, satisfy the relation below:

((thickness of lower close-adhesion layer)+(thickness of upper close-adhesion layer))/(thickness of low-$k$ insulating film≦0.4      (formula 2).

4. The method of manufacturing a semiconductor device according to claim 2, further comprising:
a capping film provided below said insulating film,
wherein carbon contents of said capping film, said close-adhesion layer, and said low-k insulating film satisfy the relation below:

capping film<close-adhesion layer<low-k insulating film.

5. The method of manufacturing a semiconductor device according to claim 1,
wherein said insulating film is formed to have a larger density in at least either one of the end portions of the film in the thickness-wise direction, as compared with the density in the center portion in the thickness-wise direction.

6. The method of manufacturing a semiconductor device according to claim 1,
wherein said insulating film is formed to have a larger value of O/Si (atomic ratio) in at least either one of the end portions of the film in the thickness-wise direction, as compared with the level in the center portion in the thickness-wise direction.

7. The method of manufacturing a semiconductor device according to claim 1,
wherein said insulating film is formed to have a smaller C/Si (atomic ratio) in at least either one of the end portions of the film in the thickness-wise direction, as compared with the ratio in the center portion in the thickness-wise direction.

8. The method of manufacturing a semiconductor device according to claim 1,
wherein a high-frequency output and a low-frequency output, at least either at the start of formation or at the end of formation of said insulating film, satisfy the relation below:

low-frequency output ($W$)/high-frequency output ($W$)≧0.1      (formula 1).

9. The method of manufacturing a semiconductor device according to claim 1,
wherein said insulating film is derived from a cyclic organosilica compound as a source material represented by the formula 3 below, where each of R1 and R2 represents an unsaturated hydrocarbon group or a saturated hydrocarbon group.

[Chemical Formula 1]

(formula 3)

$$\begin{array}{c} R1 \quad R2 \\ \diagdown \diagup \\ Si \\ O \diagup \quad \diagdown O \\ | \quad\quad\quad | \\ R2-Si \quad\quad Si-R1. \\ \diagup \quad\diagdown O \diagup \quad\diagdown \\ R1 \quad\quad\quad R2 \end{array}$$

10. The method of manufacturing a semiconductor device according to claim 9,
wherein said cyclic organosilica compound has a structure represented by any one of the formulas 4, 5 and 6 below:

[Chemical Formula 2]

Formula (4)

$$\begin{array}{c} CH_2 \\ \| \\ CH \quad CH_3 \\ \diagdown \diagup \\ Si \\ O \diagup \quad \diagdown O \\ H_3C \diagdown \quad\quad\quad\quad \diagup CH \\ Si \quad\quad Si \diagdown CH_2 \\ \diagup \quad\diagdown O \diagup \quad\diagdown \\ H_2C=CH \quad\quad CH_3 \end{array}$$

[Chemical Formula 3]

Formula (5)

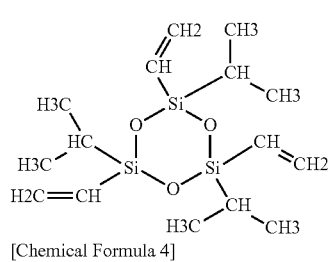

[Chemical Formula 4]

Formula (6)

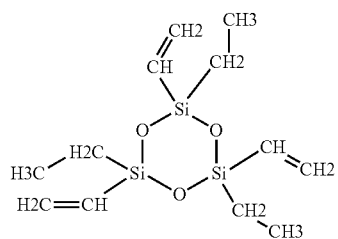

11. The method of manufacturing a semiconductor device according to claim 1,
wherein source materials of said insulating film are supplied while being diluted by an inert gas.

12. The method of manufacturing a semiconductor device according to claim 11,
wherein said inert gas is composed of one or more species of Group-0 elements.

13. A method of manufacturing a semiconductor device, comprising a process of forming at least one insulating layer, which composes an insulating interlayer, by plasma polymerization or plasma CVD,
said method being configured:
to apply, in the process of forming said insulating layer, high-frequency input and low-frequency input for inducing plasma from a single electrode, while elevating the level of low-frequency input at least either at the start of formation or at the end of formation of said insulating film, as compared with the input level in residual time zone.

* * * * *